(12) United States Patent
Shin et al.

(10) Patent No.: US 11,040,871 B2
(45) Date of Patent: Jun. 22, 2021

(54) DEVICE COMPRISING A MICRO-ELECTRO-MECHANICAL SYSTEM SUBSTRATE WITH PROTRUSIONS OF DIFFERENT HEIGHTS THAT HAS BEEN INTEGRATED WITH A COMPLEMENTARY METAL-OXIDE-SEMICONDUCTOR SUBSTRATE

(71) Applicant: INVENSENSE, INC., San Jose, CA (US)

(72) Inventors: Jongwoo Shin, Pleasanton, CA (US); Houri Johari-Galle, San Jose, CA (US); Bongsang Kim, Mountain View, CA (US); Joseph Seeger, Menlo Park, CA (US); Dongyang Kang, San Jose, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 16/206,861

(22) Filed: Nov. 30, 2018

(65) Prior Publication Data
US 2019/0185317 A1   Jun. 20, 2019

Related U.S. Application Data

(60) Provisional application No. 62/635,491, filed on Feb. 26, 2018, provisional application No. 62/598,985, filed on Dec. 14, 2017.

(51) Int. Cl.
*B81B 7/00* (2006.01)
*B81B 3/00* (2006.01)
*B81C 1/00* (2006.01)

(52) U.S. Cl.
CPC ............ *B81B 7/008* (2013.01); *B81B 3/0056* (2013.01); *B81C 1/00523* (2013.01);
(Continued)

(58) Field of Classification Search
None
See application file for complete search history.

(56) References Cited

U.S. PATENT DOCUMENTS

| 2011/0126632 | A1* | 6/2011 | McNeil | ............... G01L 19/0092 |
| | | | | 73/718 |
| 2013/0283911 | A1* | 10/2013 | Ayazi | ..................... G01C 19/56 |
| | | | | 73/504.12 |

(Continued)

*Primary Examiner* — Xiaoming Liu
(74) *Attorney, Agent, or Firm* — Amin, Turocy & Watson, LLP

(57) ABSTRACT

A device comprising a micro-electro-mechanical system (MEMS) substrate with protrusions of different heights that has been integrated with a complementary metal-oxide-semiconductor (CMOS) substrate is presented herein. The MEMS substrate comprises defined protrusions of respective distinct heights from a surface of the MEMS substrate, and the MEMS substrate is bonded to the CMOS substrate. In an aspect, the defined protrusions can be formed from the MEMS substrate. In another aspect, the defined protrusions can be deposited on, or attached to, the MEMS substrate. In yet another aspect, the MEMS substrate comprises monocrystalline silicon and/or polysilicon. In yet even another aspect, the defined protrusions comprise respective electrodes of sensors of the device.

16 Claims, 12 Drawing Sheets

(52) U.S. Cl.
CPC .. *B81C 1/00626* (2013.01); *B81B 2201/0235* (2013.01); *B81B 2201/0242* (2013.01); *B81B 2201/0257* (2013.01); *B81B 2201/0264* (2013.01); *B81B 2201/0292* (2013.01); *B81B 2207/012* (2013.01); *B81C 2203/035* (2013.01); *B81C 2203/0785* (2013.01)

(56) References Cited

U.S. PATENT DOCUMENTS

2016/0221819 A1\* 8/2016 Smeys .................. B81B 7/0041
2017/0081181 A1\* 3/2017 Zhang ................ B81C 1/00333

\* cited by examiner

DEVICE COMPRISING A MICRO-ELECTRO-MECHANICAL SYSTEM SUBSTRATE WITH PROTRUSIONS OF DIFFERENT HEIGHTS THAT HAS BEEN INTEGRATED WITH A COMPLEMENTARY METAL-OXIDE-SEMICONDUCTOR SUBSTRATE

CROSS-REFERENCE TO RELATED APPLICATION

This patent application claims priority to each of U.S. Provisional Patent Application No. 62/635,491, filed on Feb. 26, 2018, and entitled "TRIPPLE STANDOFF FOR MEMS SENSOR," and U.S. Provisional Patent Application No. 62/598,985, filed on Dec. 14, 2017, and entitled "CMOS-MEMS INTEGRATED DEVICE WITH TWO DIFFERENT OUT-OF-PLANE SENSING GAPS USING TWO DIFFERENT HEIGHTS OF STANDOFFS." The entireties of the aforementioned applications are hereby incorporated by reference herein.

TECHNICAL FIELD

This disclosure generally relates to embodiments for a device comprising a micro-electro-mechanical system (MEMS) substrate with protrusions of different heights that has been integrated with a complementary metal-oxide-semiconductor (CMOS) substrate.

BACKGROUND

Standoff height of a MEMS sensor device, e.g., including an accelerometer, a gyroscope, etc. is influential in determining a sensitivity of sensors of such device. For example, one way to increase a capacitive sensitivity of an accelerometer is to decrease a sensing air gap of the accelerometer by reducing a corresponding standoff height. However, reducing the sensing air gap can negatively affect the performance of other sensors of the MEMS sensor device. Consequently, conventional MEMS technologies have had some drawbacks, some of which may be noted with reference to the various embodiments described herein.

BRIEF DESCRIPTION OF THE DRAWINGS

Non-limiting embodiments of the subject disclosure are described with reference to the following figures, wherein like reference numerals refer to like parts throughout the various views unless otherwise specified.

DETAILED DESCRIPTION

Figure 1:
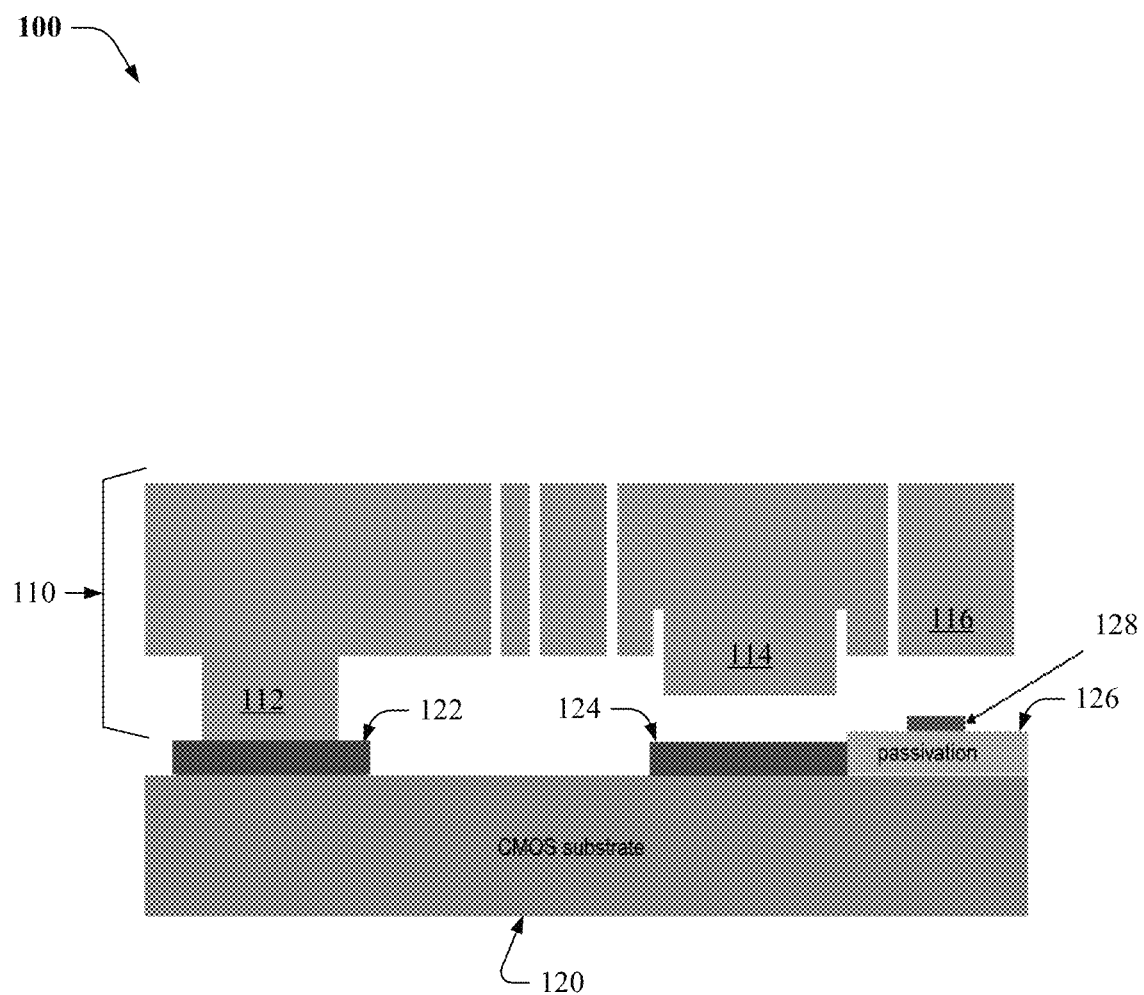
FIG. 1 illustrates a block diagram of a device comprising a cross section of a MEMS substrate with defined protrusions of different heights that has been integrated with a CMOS substrate, in accordance with various example embodiments.

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

Conventionally, reducing a sensing air gap of a sensor of a MEMS sensing device to improve a sensitivity of the sensor can negatively affect the performance of other sensors of such device. Various embodiments disclosed herein can create at least two or more protrusions of distinct heights to facilitate reduction of sensing air gap(s) of sensor(s) of a MEMS device, while maintaining and/or increasing other sensing air gap(s) of remaining sensor(s) of the MEMS device.

For example, a device can comprise a CMOS substrate and a MEMS substrate (e.g., comprising polysilicon, monocrystalline silicon, etc.) that has been bonded, attached, etc. to the CMOS substrate—the MEMS substrate comprising defined protrusions of respective distinct heights from a surface, reference location, etc. of the MEMS substrate.

In an embodiment, the defined protrusions have been formed from, etched within, etc. the MEMS substrate. In one embodiment, the defined protrusions have been deposited on, attached to, etc. the MEMS substrate.

In another embodiment, the MEMS substrate is bonded, attached, etc. to the CMOS substrate, e.g., using eutectic bonding. In yet another embodiment, a protrusion of the defined protrusions comprises an electrode, e.g., a sense electrode, a shield electrode, a self-test electrode, etc.

In an embodiment, the electrode corresponds to a sensor of the device—the sensor comprising one or more of an accelerometer, a magnetometer, a pressure sensor, a microphone, a gyroscope, etc.

In one embodiment, the MEMS substrate comprises a proof mass corresponding to the accelerometer, the magnetometer, or the gyroscope.

In another embodiment, the MEMS substrate comprises a diaphragm corresponding to the pressure sensor or the microphone.

In yet another embodiment, the device further comprises a CMOS electrode, e.g., a sense electrode, a shield electrode, a self-test electrode, etc. that has been formed, deposited, etc. on a surface of the CMOS substrate.

In an embodiment, the CMOS electrode corresponds to the sensor of the device—the sensor comprising the accelerometer, the magnetometer, the pressure sensor, the microphone, or the gyroscope.

In another embodiment, a protrusion of the defined protrusions facilitates a reduction of an electrostatic force between the MEMS substrate and the CMOS substrate.

In yet another embodiment, a method, e.g., of manufacture of a device comprising a substrate and a CMOS substrate, can comprise etching, using at least two etch mask layers, at least two protrusions in the substrate—the at least two protrusions being different heights from a surface, reference location, etc. of the substrate; and attaching the substrate to the CMOS substrate.

In an embodiment, the etching comprises: applying a first photoresist mask of the at least two etch mask layers to the substrate; based on the first photoresist mask, first etching the substrate to create the at least two protrusions, portion(s) of the at least two protrusions, etc.; removing the first photoresist mask from the substrate; applying a second photoresist mask of the at least two etch mask layers to the substrate; based on the second photoresist mask, second etching the substrate to reduce a height of the different heights of a protrusion of the at least two protrusions; and removing the second photoresist mask from the substrate.

In one embodiment, the method further comprises third etching through the substrate between a first protrusion of the at least two protrusions and a second protrusion of the at least two protrusions.

In another embodiment, the method further comprises forming a CMOS electrode on a surface of the CMOS substrate, or depositing the CMOS electrode on the surface of the CMOS substrate.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

Furthermore, to the extent that the terms "includes," "has," "contains," and other similar words are used in either the detailed description or the appended claims, such terms are intended to be inclusive—in a manner similar to the term "comprising" as an open transition word—without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Furthermore, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art.

Referring now to FIG. 1, a block diagram (100) of a cross section of a device comprising a MEMS substrate (110)—with defined protrusions (112, 114, 116) of different heights—that had been integrated with a CMOS substrate (120) is illustrated, in accordance with various example embodiments. In embodiment(s), the MEMS substrate can comprise polysilicon, monocrystalline silicon, etc. As illustrated by FIG. 1, the MEMS substrate comprises defined protrusions of respective distinct heights from a surface, reference point, reference location, etc. of the MEMS substrate.

In this regard, in an embodiment, at least a portion of the defined protrusions can be formed from the MEMS substrate, e.g., via etching of the MEMS substrate, according to respective defined heights from a surface, unetched surface, etc. of the MEMS substrate; from a reference point, z-axis location, etc. of the MEMS substrate, etc. In another embodiment, at least a portion of the defined protrusions can be deposited on, or attached to, the MEMS substrate.

In yet other embodiment(s), a protrusion of the defined protrusions comprises an electrode (not shown), e.g., a sense electrode, a shield electrode, a self-test electrode, etc. In an embodiment, the electrode corresponds to a sensor (not shown) of the device—the sensor comprising one or more of an accelerometer, a magnetometer, a pressure sensor, a microphone, a gyroscope, etc. In another embodiment, the protrusion facilitates a reduction of an electrostatic force between the MEMS substrate and the CMOS substrate.

In one embodiment, the MEMS substrate comprises a proof mass (not shown) corresponding to the accelerometer, the magnetometer, or the gyroscope. In another embodiment, the MEMS substrate comprises a diaphragm (not shown) corresponding to the pressure sensor or the microphone.

Returning now to FIG. 1, the device comprises a CMOS electrode (124), e.g., a sense electrode, a shield electrode, a self-test electrode, etc. that has been formed, deposited, etc. on a surface of the CMOS substrate. In an embodiment, the CMOS electrode corresponds to a sensor (not shown) of the device comprising a protrusion of the defined protrusions—the protrusion corresponding to an accelerometer, a magnetometer, a pressure sensor, a microphone, or a gyroscope of the device.

Further, the device comprises a passivation layer (126) that has been formed, deposited, etc. on the surface of the CMOS substrate, and further comprises a layer (128), e.g., comprising titanium nitride (TiN), that has been formed, deposited, etc. on the passivation layer. Furthermore, the MEMS substrate is bonded to the CMOS substrate using a bond (122), e.g., a eutectic bond, an aluminum-germanium (Al-GE) eutectic bond, etc. In this regard, the CMOS electrode and the layer that has been formed, deposited, etc. on the passivation layer correspond to respective sensors of the device.

Figure 2:
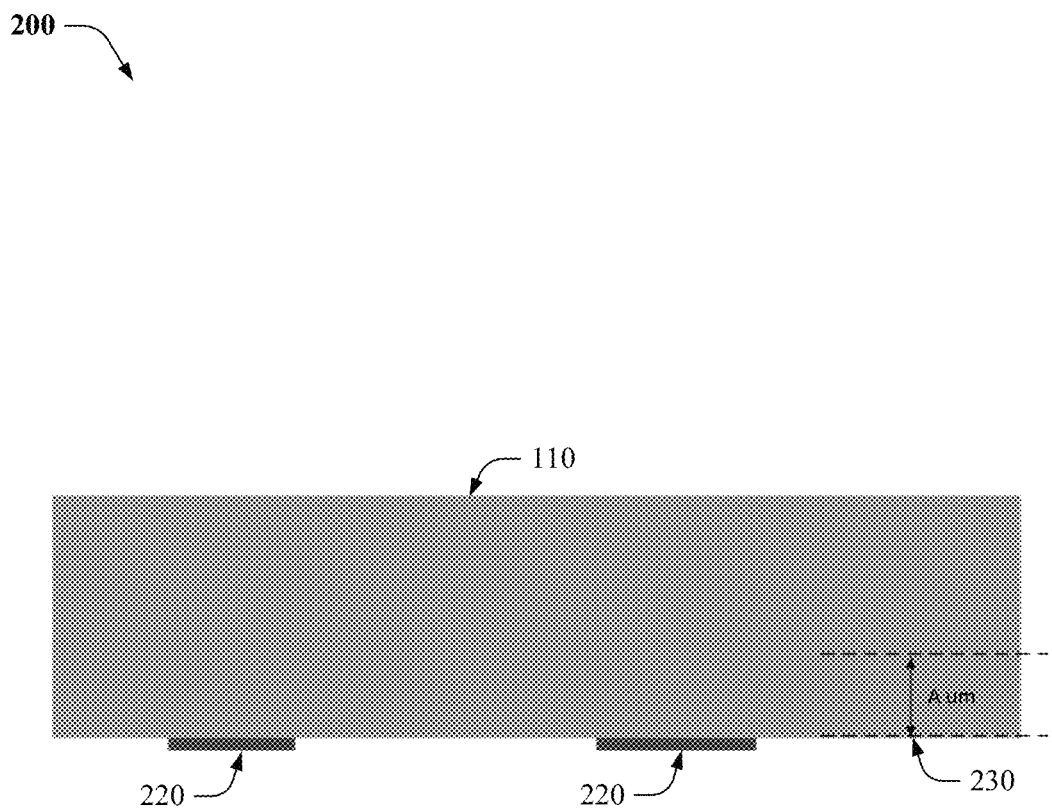
FIG. 2 illustrates a block diagram of a cross section of a MEMS substrate with a first photoresist mask that has been applied to the MEMS substrate, in accordance with various example embodiments.

Referring now to FIGS. 2-8, respective cross sections of a MEMS substrate corresponding to fabrication of the MEMS substrate are illustrated, in accordance with various example embodiments. In this regard, FIG. 2 illustrates a block diagram (200) of a cross section of the MEMS substrate with a first photoresist mask (220) that has been applied to the MEMS substrate, in accordance with various example embodiments. In this regard, the first photoresist mask prevents portions of the MEMS substrate contacting the first photoresist mask from being etched away to a defined depth (230), e.g., from a surface, e.g., unetched surface, defined position, defined location, etc. of the MEMS substrate; from a reference point, z-axis location, etc. of the MEMS substrate, etc.

Figure 3:
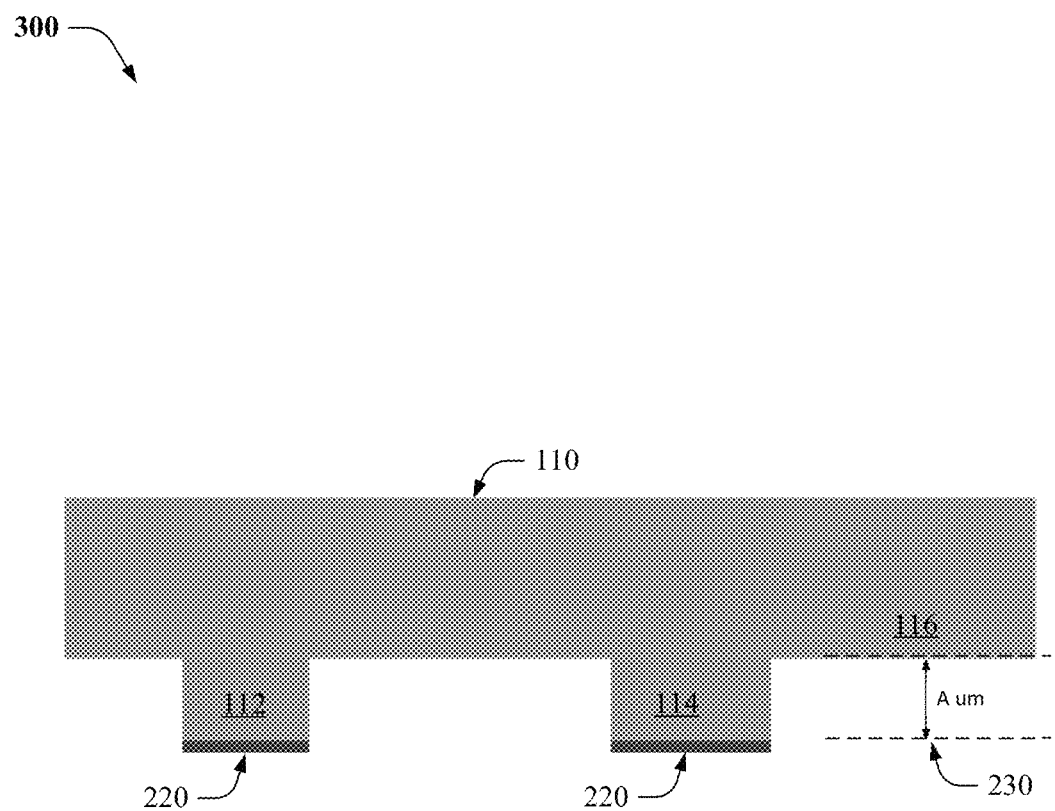
FIG. 3 illustrates a block diagram of the cross section of the MEMS substrate that has been etched, based on the first photoresist mask, to create at least two protrusions, in accordance with various example embodiments.

FIG. 3 illustrates a block diagram (300) of the cross section of the MEMS substrate that has been etched, based on the first photoresist mask, to create one or more portions of at least two protrusions, in accordance with various example embodiments. In this regard, the MEMS substrate has been etched the defined depth (A), e.g., A um, from an unetched surface of the MEMS substrate—creating a first protrusion (112), a second protrusion (116), and a portion of a third protrusion (114).

Figure 4:
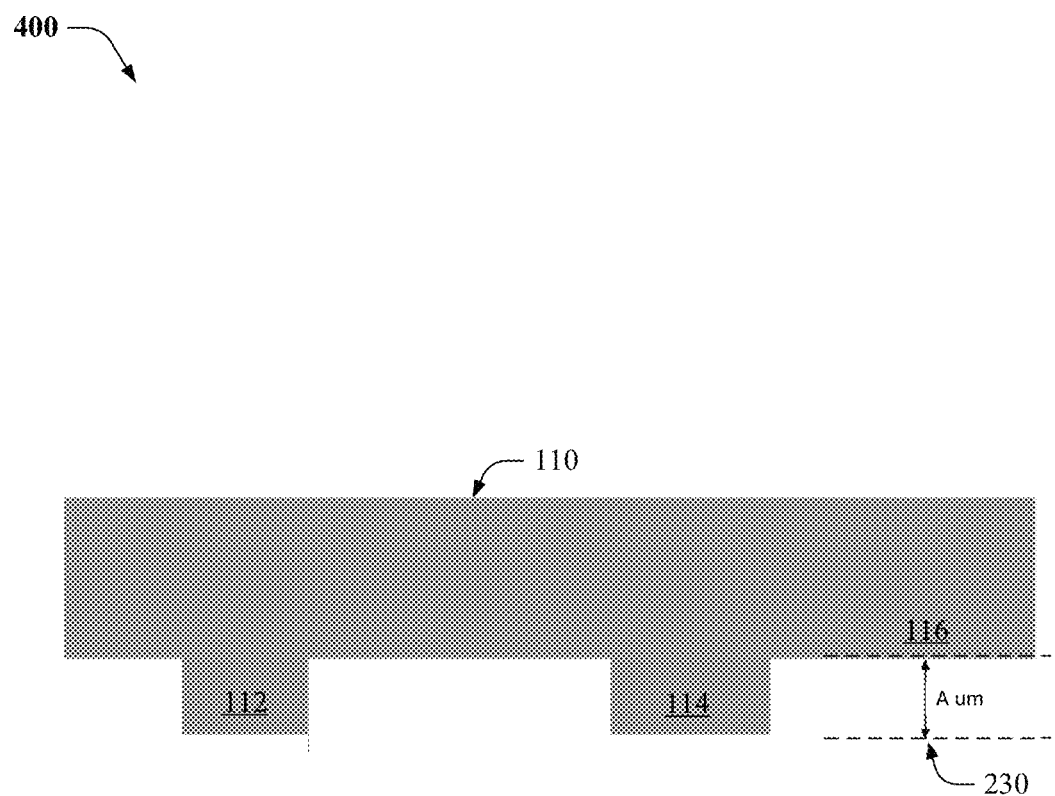
FIG. 4 illustrates a block diagram of the cross section of the MEMS substrate after the first photoresist mask has been removed from the MEMS substrate—after the MEMS substrate has been etched, in accordance with various example embodiments.

FIG. 4 illustrates a block diagram (400) of the cross section of the MEMS substrate after the first photoresist mask has been removed from the MEMS substrate—after the MEMS substrate has been etched, in accordance with various example embodiments.

Figure 5:
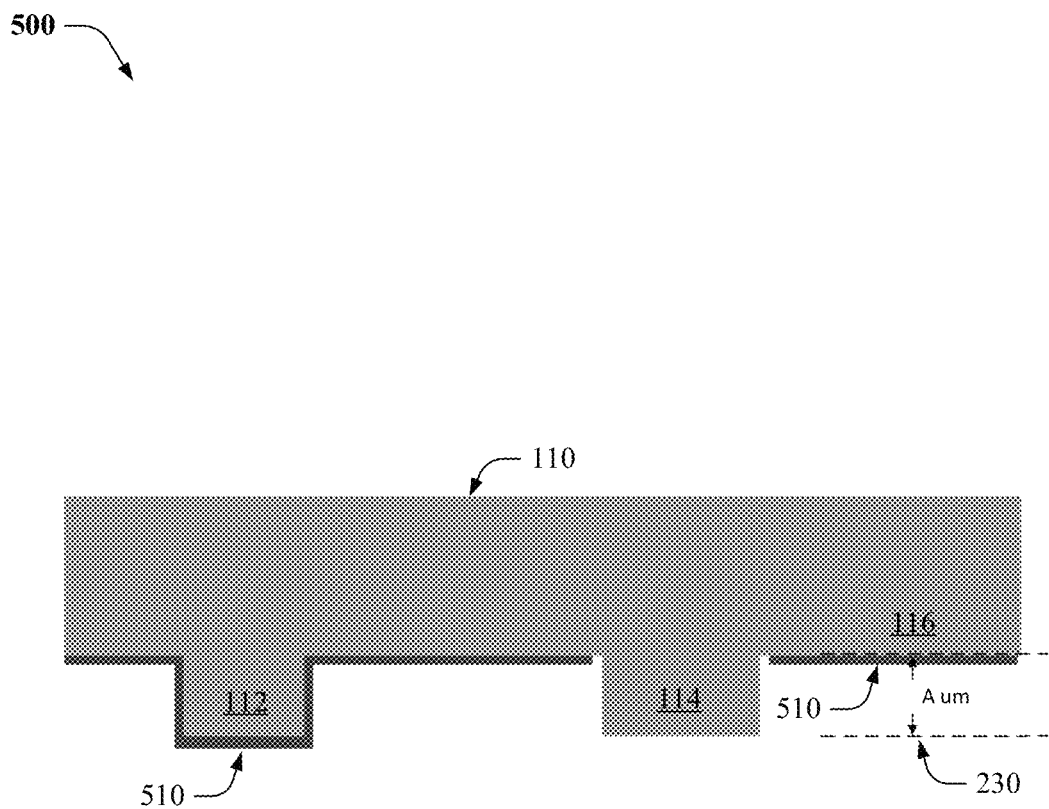
FIG. 5 illustrates a block diagram of the cross section of the MEMS substrate with a second photoresist mask that has been applied to the MEMS substrate—after the first photoresist mask has been removed from the MEMS substrate, in accordance with various example embodiments.

FIG. 5 illustrates a block diagram (500) of the cross section of the MEMS substrate with a second photoresist mask (510) that has been applied to the MEMS substrate—after the first photoresist mask has been removed from the MEMS substrate, in accordance with various example embodiments. In this regard, the second photoresist mask prevents portions of the MEMS substrate contacting the second photoresist mask, e.g., the first protrusion (112) and the second protrusion (116), from being etched away, further etched away, etc.

Figure 6:
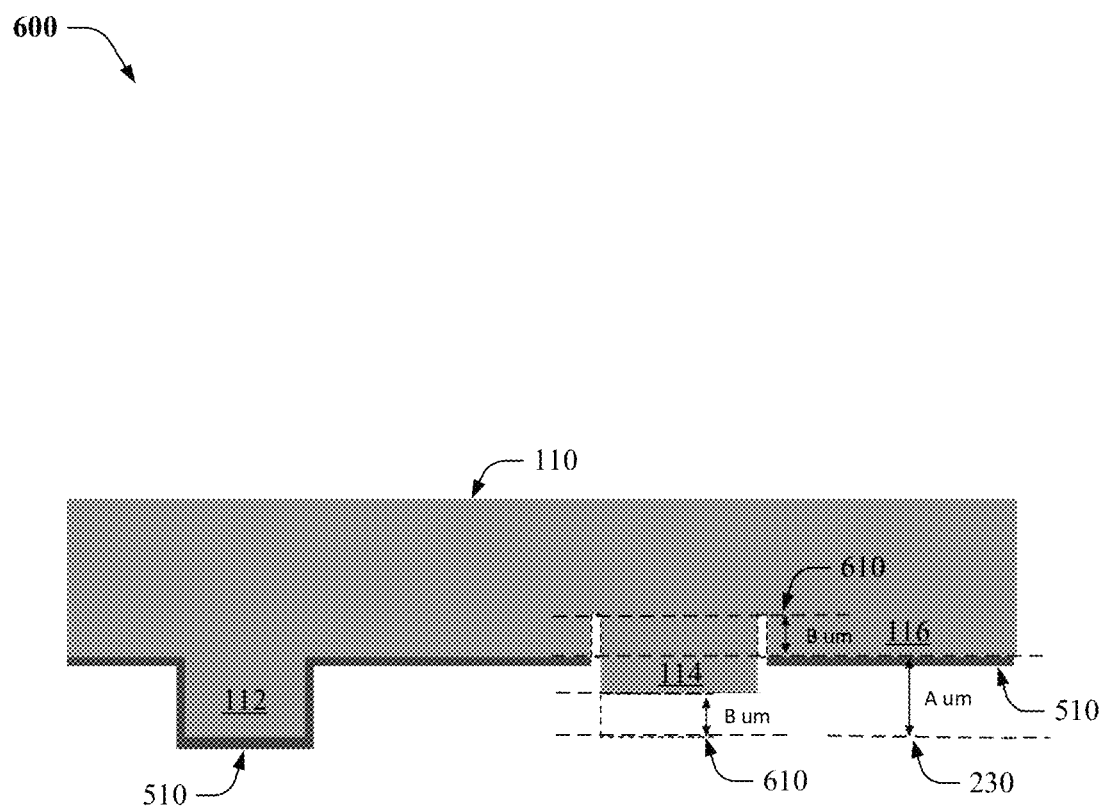
FIG. 6 illustrates a block diagram of the cross section of the MEMS substrate that has been etched, based on the second photoresist mask, to reduce a height of a protrusion of the at least two protrusions, in accordance with various example embodiments.

FIG. 6 illustrates a block diagram (600) of the cross section of the MEMS substrate that has been etched, based on the second photoresist mask, to reduce a height of a protrusion of the at least two protrusions, in accordance with various example embodiments. In this regard, the MEMS substrate has been further etched, by a defined depth (610, (B)), e.g., B um, from the unetched surface of the MEMS substrate, from the reference point, z-axis location, etc. of the MEMS substrate, etc.

Figure 7:
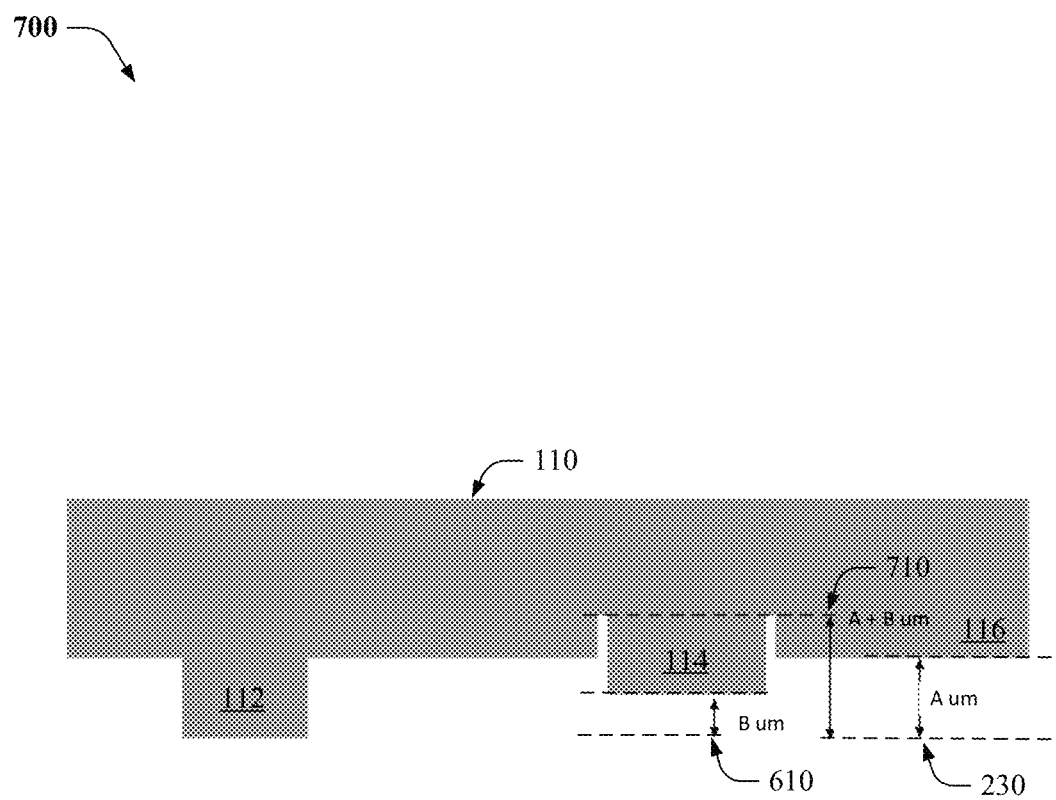
FIG. 7 illustrates a block diagram of the cross section of the MEMS substrate after the second photoresist mask has been removed from the MEMS substrate—after the MEMS substrate has been etched, in accordance with various example embodiments.

FIG. 7 illustrates a block diagram (700) of the cross section of the MEMS substrate after the second photoresist mask has been removed from the MEMS substrate—after the MEMS substrate has been etched, further etched, etc., in accordance with various example embodiments. In this regard, etching the substrate based on the first photoresist mask and the second photoresist mask created the first protrusion (112), e.g., comprising the unetched surface of the MEMS substrate; the second protrusion (116), e.g., comprising a first portion of the MEMS substrate that has been etched by a first defined depth (710, (A+B)), e.g., A+B um, from the unetched surface of the MEMS substrate, from the reference point, z-axis location, etc. of the MEMS substrate, etc.; and the third protrusion (114), e.g., comprising a second portion of the MEMS substrate that has been etched by a second defined depth (610, (B)), e.g., B um, from the unetched surface of the MEMS substrate, from the reference point, z-axis location, etc. of the MEMS substrate, etc.

Figure 8:
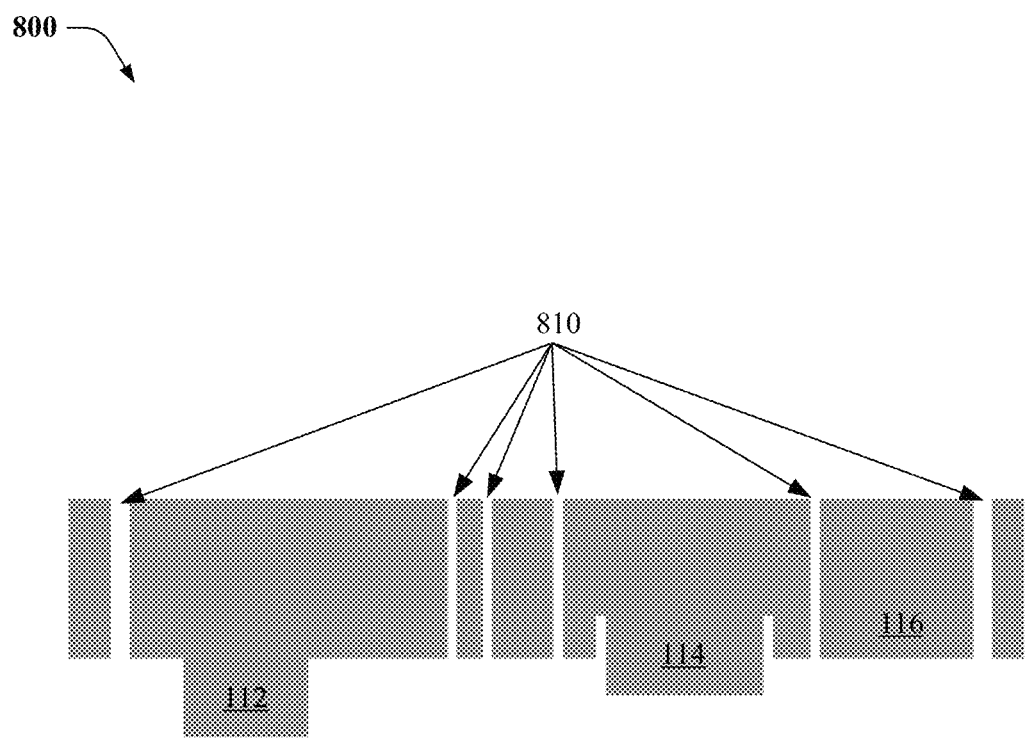
FIG. 8 illustrates a block diagram of the cross section of the MEMS substrate after the MEMS substrate has been etched through the MEMS substrate between a first protrusion of the at least two protrusions and a second protrusion of the at least two protrusions, in accordance with various example embodiments.

Referring now to FIG. 8, a block diagram (800) of the cross section of the MEMS substrate after the MEMS substrate has been etched through the MEMS substrate between a first protrusion of the at least two protrusions and a second protrusion of the at least two protrusions is illustrated, in accordance with various example embodiments. In this regard, in an embodiment, respective etches (810), e.g., actuator etches, can be performed through the MEMS substrate between the first protrusion, the second protrusion, and the third protrusion.

Figure 9:
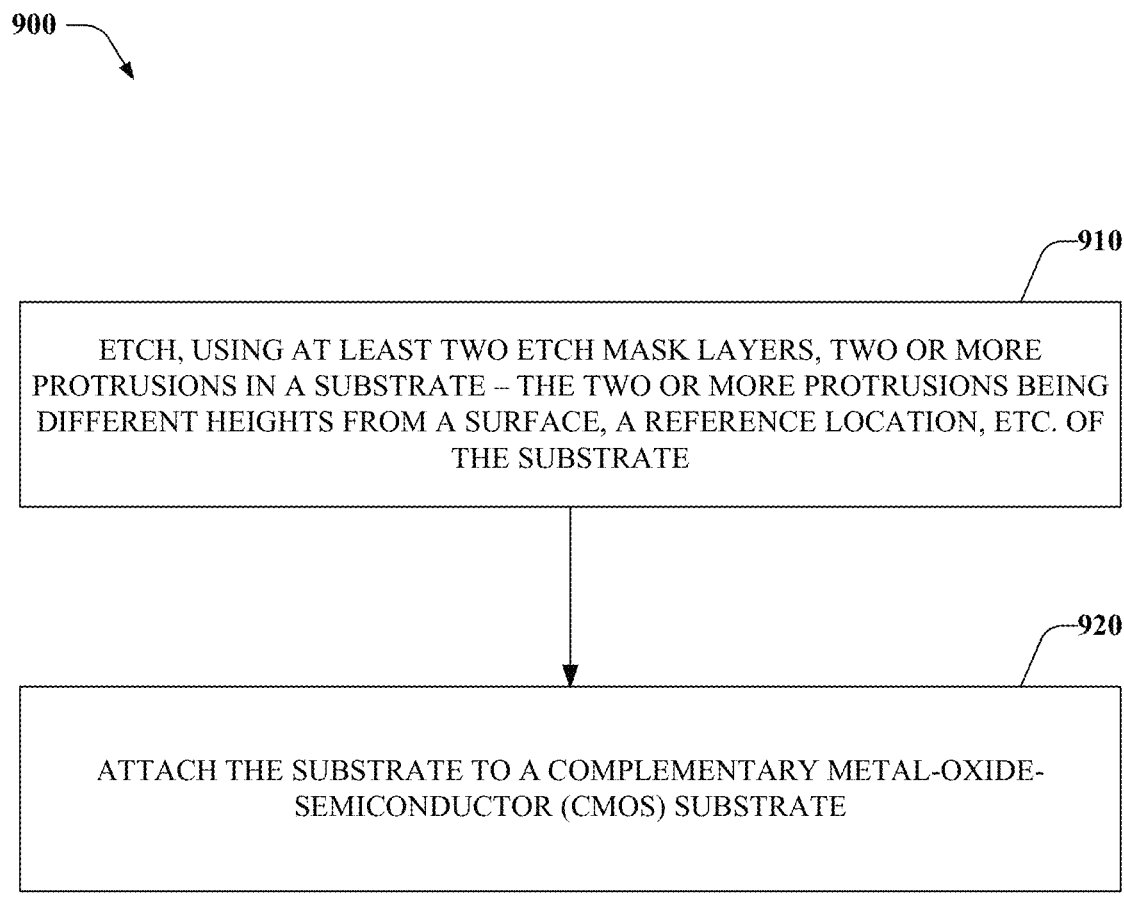
FIG. 9 illustrates a method of manufacture of a device comprising a substrate with two or more protrusions of different heights that has been integrated with a CMOS substrate, in accordance with various example embodiments.

Now referring to FIG. 9, a method of manufacture (900) of a device comprising a substrate with two or more protrusions of different heights that has been integrated with a CMOS substrate is illustrated, in accordance with various example embodiments. At 910, two or more different, distinct, etc. protrusions can be etched in the substrate using at least two etch mask layers—the two or more different, distinct, etc. protrusions being different, distinct, etc. heights from a surface, a reference location, etc. of the substrate, e.g. with respect to a defined axis, etc., of the substrate.

At 920, the substrate can be attached, e.g., via a bond, eutectic bond, etc. to the CMOS substrate. In this regard, in embodiment(s), the two or more different, distinct, etc. protrusions can correspond to respective sensors of the device.

Figure 10:
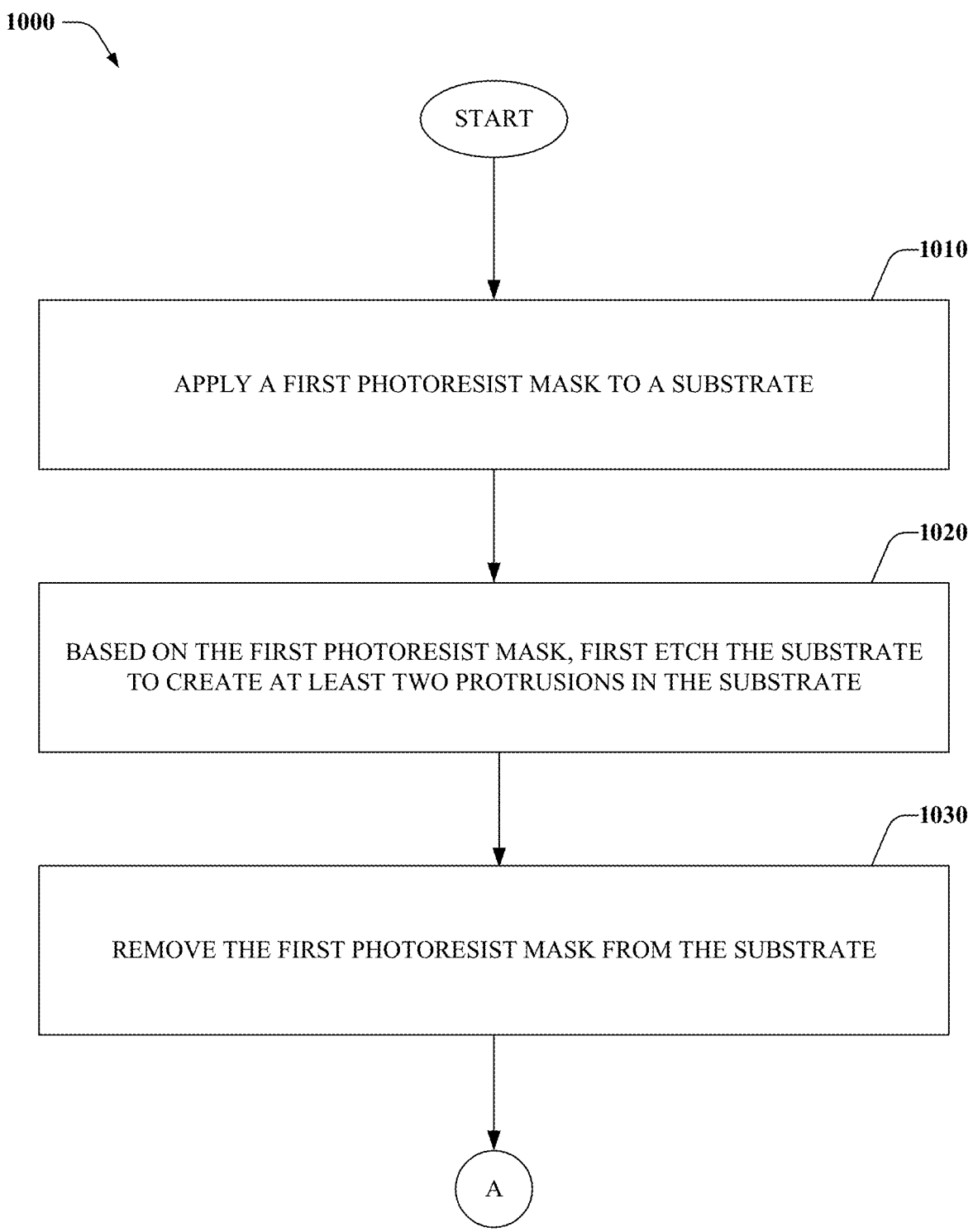
FIGS. 10-12 illustrate another method of manufacture of a device comprising a substrate with two or more protrusions of different heights that has been integrated with a CMOS substrate, in accordance with various example embodiments.
Figure 11:
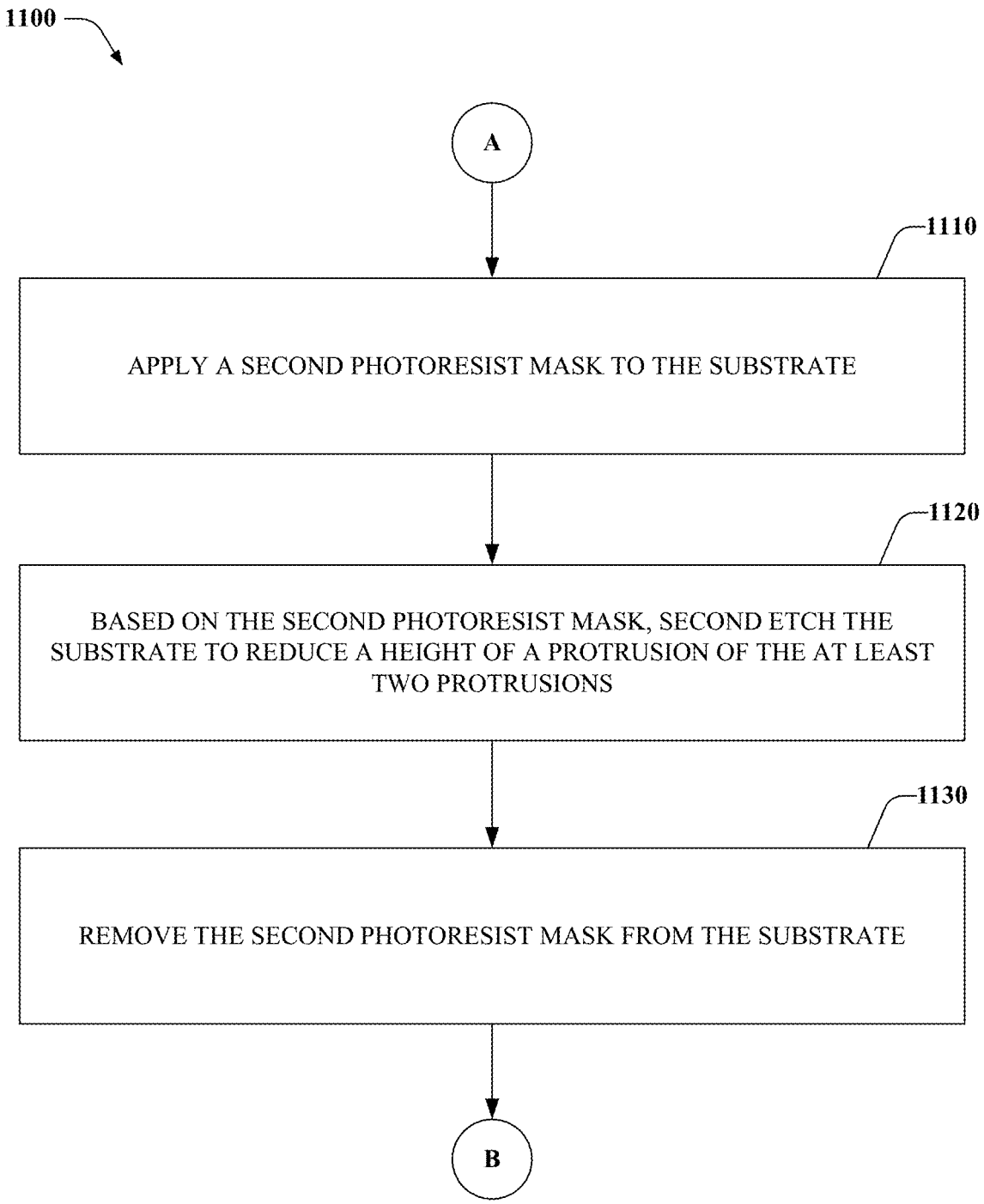
Figure 12:
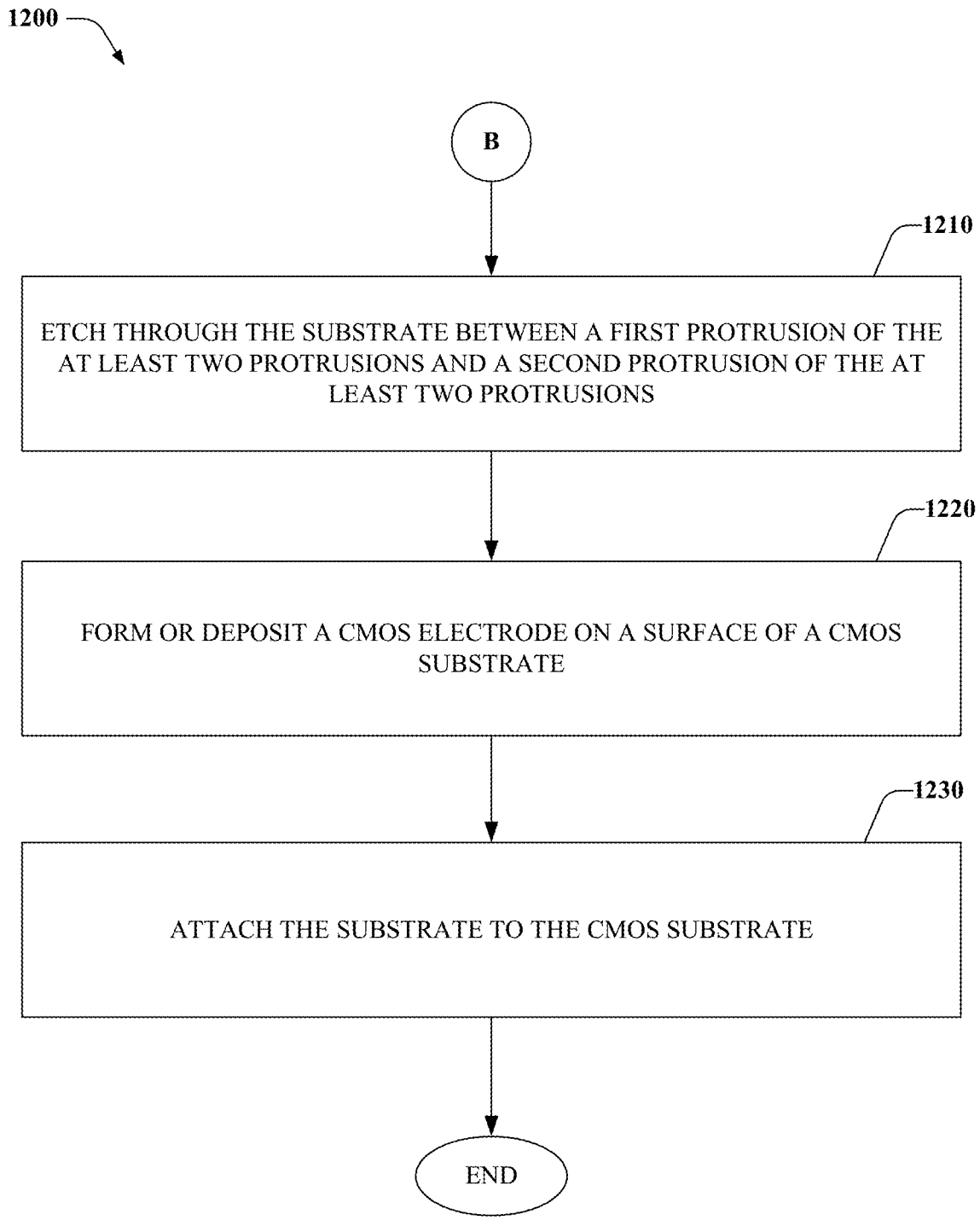

FIGS. 10-12 illustrate another method (1000-1200) of manufacture of a device comprising a substrate with two or more protrusions of different heights that has been integrated with a CMOS substrate, in accordance with various example embodiments. At 1010, a first photoresist mask can be applied to the substrate. At 1020, the substrate can be etched, based on the first photoresist mask, to create at least two protrusions in the substrate. At 1030, the first photoresist mask can be removed from the substrate.

At 1110, a second photoresist mask can be applied to the substrate. At 1120, the substrate can be etched, based on the second photoresist mask, to reduce a height of a protrusion of the at least two protrusions. At 1130, the second photoresist mask can be removed from the substrate.

At 1210, the substrate can be etched, through the substrate, e.g., via an actuator etch, between a first protrusion of the at least two protrusions and a second protrusion of the at least two protrusions. At 1220, a CMOS electrode, e.g., a sense electrode, a shield electrode, a self-test electrode, etc. can be formed or deposited on a surface of the CMOS substrate. At 1230, the substrate can be attached, bonded, etc. to the CMOS substrate.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A device comprising:
   a complementary metal-oxide-semiconductor (CMOS) substrate; and
   a micro-electro-mechanical system (MEMS) substrate that has been bonded to the CMOS substrate, wherein the MEMS substrate comprises defined protrusions of respective distinct heights from a top surface of the MEMS substrate, wherein each protrusion of the defined protrusions corresponds to a distinct electrode that has been formed on the CMOS substrate, wherein the MEMS substrate has been etched between a first protrusion of the defined protrusions and a second protrusion of the defined protrusions to a defined depth from an unetched surface of the MEMS substrate, and wherein the defined depth is less than a depth from the unetched surface of the MEMS substrate to the top surface of the MEMS substrate.

2. The device of claim 1, wherein the defined protrusions have been formed from the MEMS substrate.

3. The device of claim 1, wherein the defined protrusions have been deposited on the MEMS substrate or attached to the MEMS substrate.

4. The device of claim 1, wherein the MEMS substrate comprises at least one of monocrystalline silicon or polysilicon.

5. The device of claim 1, wherein the MEMS substrate is bonded to the CMOS substrate using eutectic bonding.

6. The device of claim 1, wherein a protrusion of the defined protrusions comprises an electrode.

7. The device of claim 6, wherein the electrode comprises a sense electrode, a shield electrode, or a self-test electrode.

8. The device of claim 6, wherein the electrode corresponds to a sensor of the device.

9. The device of claim 8, wherein the sensor comprises at least one of an accelerometer, a magnetometer, a pressure sensor, a microphone, or a gyroscope.

10. The device of claim 9, wherein the MEMS substrate comprises a proof mass corresponding to the accelerometer, the magnetometer, or the gyroscope.

11. The device of claim 9, wherein the MEMS substrate comprises a diaphragm corresponding to the pressure sensor or the microphone.

12. The device of claim 1, further comprising a CMOS electrode that has been formed on a surface of the CMOS substrate or deposited on the surface of the CMOS substrate.

13. The device of claim 12, wherein the CMOS electrode comprises a sense electrode, a shield electrode, or a self-test electrode.

14. The device of claim 12, wherein the CMOS electrode corresponds to a sensor of the device.

15. The device of claim 14, wherein the sensor comprises at least one of an accelerometer, a magnetometer, a pressure sensor, a microphone, or a gyroscope.

16. The device of claim 8, wherein a protrusion of the defined protrusions facilitates a reduction of an electrostatic force between the MEMS substrate and the CMOS substrate.

* * * * *